(12) United States Patent
Nautiyal et al.

(10) Patent No.: US 10,839,861 B2
(45) Date of Patent: Nov. 17, 2020

(54) ROUTING STRUCTURES FOR MEMORY APPLICATIONS

(71) Applicant: Arm Limited, Cambridge (GB)

(72) Inventors: Vivek Nautiyal, Milpitas, CA (US); Satinderjit Singh, Fremont, CA (US); Abhishek B. Akkur, San Jose, CA (US); Shri Sagar Dwivedi, San Jose, CA (US); Fakhruddin Ali Bohra, San Jose, CA (US); Jungtae Kwon, San Jose, CA (US); Jitendra Dasani, Cupertino, CA (US); Manoj Puthan Purayil, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/881,704

(22) Filed: Jan. 26, 2018

(65) Prior Publication Data

US 2019/0237111 A1 Aug. 1, 2019

(51) Int. Cl.
*G11C 5/06* (2006.01)
*G11C 7/06* (2006.01)
*G11C 7/10* (2006.01)

(52) U.S. Cl.
CPC .............. *G11C 5/063* (2013.01); *G11C 5/066* (2013.01); *G11C 7/06* (2013.01); *G11C 7/1006* (2013.01)

(58) Field of Classification Search
CPC ........... G11C 5/063; G11C 7/06; G11C 5/066; G11C 7/1006; G11C 7/1069; G11C 7/1096; G11C 8/12; G11C 7/1012; G11C 7/1048; G11C 7/18
See application file for complete search history.

(56) References Cited

U.S. PATENT DOCUMENTS

| 5,999,436 | A | * | 12/1999 | Kuroki | G11C 7/18 365/205 |
|---|---|---|---|---|---|
| 6,240,006 | B1 | * | 5/2001 | Kawasaki | G11C 5/063 365/164 |
| 8,644,047 | B2 | * | 2/2014 | Onda | G11C 7/02 365/53 |
| 2001/0014046 | A1 | * | 8/2001 | Sakamoto | G11C 7/06 365/205 |
| 2002/0003736 | A1 | * | 1/2002 | Fujisawa | G11C 7/18 365/203 |
| 2003/0067018 | A1 | * | 4/2003 | Kitsukawa | G11C 5/025 257/207 |
| 2004/0257869 | A1 | * | 12/2004 | Lammers | G11C 11/15 365/173 |
| 2005/0286285 | A1 | * | 12/2005 | Lee | G11C 5/063 365/63 |
| 2006/0239094 | A1 | * | 10/2006 | Maki | G11C 7/06 365/63 |
| 2007/0104002 | A1 | * | 5/2007 | Edahiro | G11C 7/06 365/203 |

(Continued)

*Primary Examiner* — Khamdan N. Alrobaie
(74) *Attorney, Agent, or Firm* — Pramudji Law Group PLLC; Ari Pramudji

(57) ABSTRACT

Various implementations described herein are directed to an integrated circuit having multiple banks of memory cells and a local input/output (IO) component for each bank of the multiple banks. The integrated circuit may include multiple signal lines that are coupled to the multiple banks with the local IO components. At least one signal line of the multiple signal lines is wider than one or more of the other signal lines.

19 Claims, 13 Drawing Sheets

(56) References Cited

U.S. PATENT DOCUMENTS

| | | | |
|---|---|---|---|
| 2008/0205177 A1* | 8/2008 | Kim | G11C 5/025 365/205 |
| 2015/0309750 A1* | 10/2015 | Chen | G06F 3/0625 711/104 |
| 2016/0035420 A1* | 2/2016 | Konno | G11C 13/0028 365/51 |

* cited by examiner

ROUTING STRUCTURES FOR MEMORY APPLICATIONS

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional memory designs, pitch of bitcells is limited in a dimension along a poly direction of a wordline while perpendicular to a poly direction of the bitlines and local supply lines. Typically, the dimension along the poly direction is similar across different types of bitcells, such as high capacity (HC), high density (HD), and ultra high density (UHD). However, the perpendicular dimension to the poly direction is constrained for ultra high density (UHD) bitcells. For multibank memory, global output from a sense amplifier and global data, write mask, and supply are ran in top metal layers, which often limits the performance of multibank arrays with high density bitcells.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
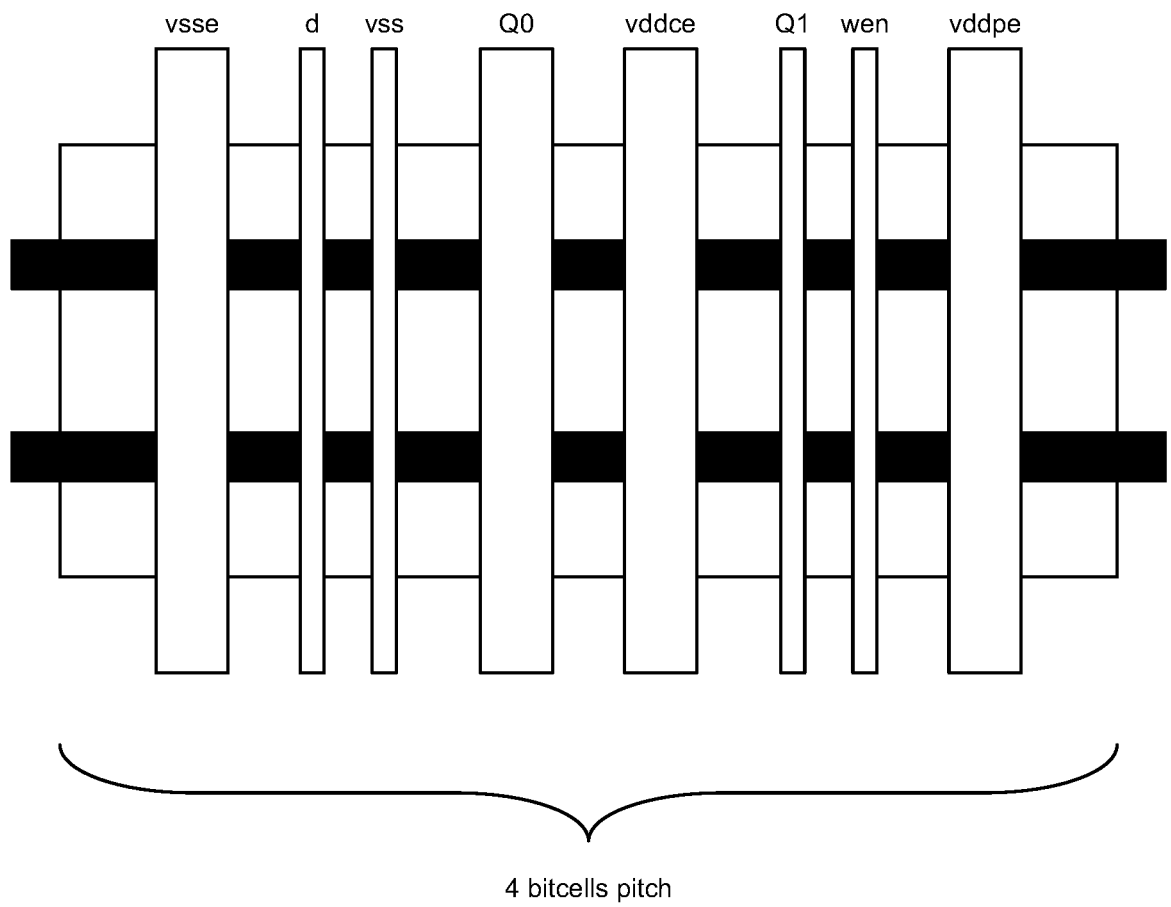
FIGS. 1-14 illustrate diagrams of routing structures for memory applications in accordance with various implementations described herein.

Various implementations described herein are directed to routing structures for memory applications. For instance, various implementations described herein provide for schemes, techniques and methods that optimize routing structures for high performance memories, such as, e.g., high speed memory architecture for multibank memory arrays utilizing high density (HD) bitcells and/or ultra high density (UHD) bitcells.

In some memory applications, to reduce periphery, bitcells may be multiplexed together, wherein each pair of bitlines may represent a column, and multiplexed bitlines may represent a bit. In case of mux4, 4 bitcells (4 pair of bitlines) are multiplexed together in local input/output (IO) with column multiplexer circuitry. Local IO may use a sense amplifier and a write driver. The sense amplifier senses differential voltage that is built-up in one of the selected pair of bitlines, and an output of the sense amplifier is driven to one or more output pins. In some cases, a lower level of metals is used for internal routing of the multiplexer, sense amplifier, and write driver. In multibank memory applications, output from multiple local IOs are routed over the bitcells and other local IOs, and a next level of multiplexing may select output from the local IO of an addressed bank.

Further, outputs from each local IO runs in a pitch of a multiplexer. For instance, M4 FB8 memory configurations have multiplexer (M) 4 with flexible banking (FB) 8, and there are 4 local IO with 4 outputs Q<3:0> routed in the pitch of 4 bitcells. These global signals are routed in higher level of metal, such as, e.g., metal 4. Global input data (D) is routed in higher metal. Write mask enable (WEN) is routed in higher metal. Global supplied source voltages vddce/vddpe/vsse are routed in higher metal. Power gated vss is also routed in higher metal. Since signals (D, WEN, vddce/vddpe/vsse, vss) are routed in the pitch of 4 bitcells, there may be a limitation on width and spacing of these signals. In finer geometries, a certain pattern of metal width and spacing may constrain use of wide metal. Since these global signals travel long distance to reduce resistance (R), wider metal with larger spacing is likely desirable, but because of limited space, some of these signals may not run in wider metal.

Thus, various implementations described herein may improve timing of memory by optimally utilizing metal width and spacing such that output from a farthest bank is routed in wider metal and/or with larger spacing, while output from a nearer bank to output pin is routed in narrower metal and/or with smaller spacing. As such, implementations described herein may introduce optimized Q routing, wherein sense amplifier output from a farthest bank is ran in wider metal lines such that resistance-capacitance (RC) delay is reduced. While other metal lines are routed from nearer pins and are run with not so wide metal (e.g., narrower metal lines), they likely may not reduce performance. Accordingly, introducing and utilizing these optimized routing schemes may provide some symmetrical memory architectures with improved extra performance and a competitive edge.

Various implementations described herein provide for utilization of wide metal width and/or space for routing from a farthest bank, wherein this concept may be applied to Q output, D/WEN inputs, address and other control signals. In some instances, the term "address" may refer to an input address, such as, e.g., an address for bank selection as shown below in FIG. 12, wherein BSEL01 and BSEL23 refer to bank address. Various implementations described herein provide for ganging lines, such as, e.g., parallel coupling of unused metal lines (or inactive metal lines) to reduce output line resistance. Various implementations described herein provide for a compiler that may be designed for maximum range and/or supported options, for other range/options tracks that are unused, wherein unused tracks may be used for reducing wire resistance of critical signals. Various implementations described herein provide for optimal utilization of wide metal width/space and establishing parallel coupling with unused tracks (or inactive tracks) with via/stub programming, which may be achieved together or independent of each other. As described in greater detail herein below, these optimized routing schemes and techniques may be implemented with output path improvement that may be achieved for various different M (Multiplexer) 4, 8, configurations and 16 and FB (Flexible Banking) 4 and 8 configurations.

Various implementations of routing structures will now be described in greater detail herein with reference to FIGS. 1-14.

FIG. 1 illustrates a diagram of a routing structure 100 for memory applications in accordance with various implementations described herein.

As shown in FIG. 1, the routing structure 100 may include multiple routing wires (or metal straps) including, e.g., a multi-route structure for metal 4 routing in a pitch of a 4 bitcell structure. Various pitches may be utilized herein, such as, e.g., an eight (8) bitcell pitch or a sixteen (16) bitcell pitch. The routing wires are represented by multiple signal lines for one or more data signal lines (e.g., d), one or more data output signal lines (e.g., Q0, Q1), one or more enable signal lines (e.g., wen), one or more voltage supply lines (e.g., vddce, vddpe), and one or more ground supply lines (e.g., vsse, vss). At least one signal line of the multiple signal lines is wider than one or more of the other signal lines. Some of the multiple signal lines are wider than some of the other multiple signal lines. For instance, one or more or some of the multiple signal lines may include wider signal lines, such as, e.g., vsse, Q0, Q1, vddpe, and one or more or some of the other multiple signal lines may include narrower signal lines, such as, e.g., d, vss, Q1, wen. As such, the multiple signal lines may include one or more wider signal lines and one or more narrower signal lines. Further, the multiple signal lines may include multiple metal lines, wherein the one or more wider signal lines may include one or more wider metal signal lines, and the one or more narrower signal lines may include one or more narrower metal signal lines.

Figure 2:
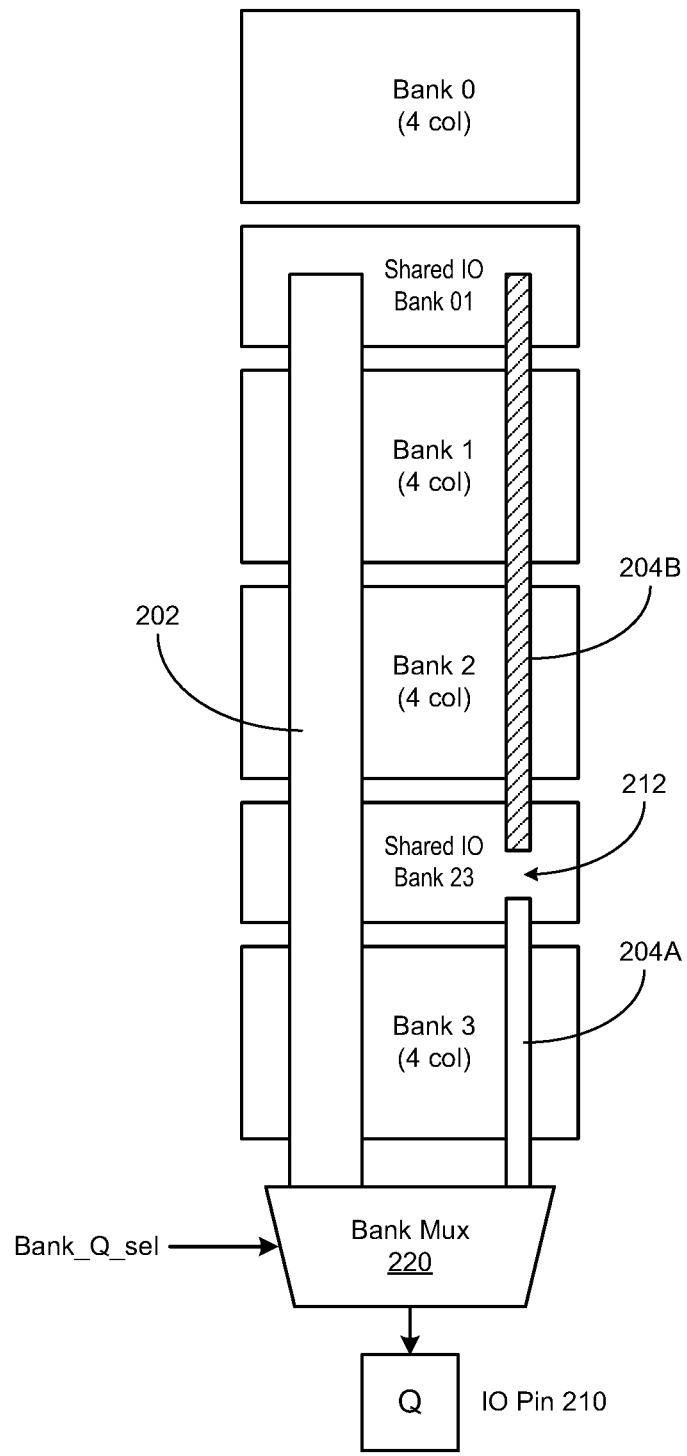

FIG. 2 illustrates a diagram of a routing structure 200 for memory applications in accordance with various implementations described herein.

As shown in FIG. 2, the routing structure 200 may include multiple banks of memory cells (e.g., M4 FB4: Bank 0, Bank 1, Bank, 2, Bank 3). In some instances, the multiple banks of memory cells (Bank 0-3) may include multiple banks of bitcells, such as, e.g., ultra high density (UHD) bitcells. In other instances, the multiple banks of bitcells may include high capacity (HC) or high density (HD) bitcells. The pitch of the bitcells may vary depending on the memory application. For instance, each bank of memory cells of the multiple banks of memory cells may have a four (4) bitcell pitch. In other instances, an eight (8) bitcell pitch or a sixteen (16) bitcell pitch may be utilized.

The routing structure 200 may include local input/output (IO) components (IO Bank 01, IO bank 23) for each bank of the multiple banks (Bank 0-3). The IO components (IO Bank 01, IO bank 23) may be shared between multiple banks of memory cells. For instance, the IO Bank 01 may be shared by Bank 0 and Bank 1, and the IO Bank 23 may be shared by Bank 2 and Bank 3. In this instance, the IO Bank 01 may be referred to as a shared IO Bank 01, and the IO Bank 23 may be referred to as a shared IO Bank 23.

The routing structure 200 may include multiple signal lines 202, 204A, 204B coupled to the multiple banks (Bank 0-3) with the local IO components (IO Bank 01, 10 bank 23). The multiple signal lines 202, 204A, 204B may be embodied as data signal lines (e.g., d), output signal lines (e.g., Q0, Q1), enable signal lines (e.g., wen), voltage supply lines (e.g., vddce, vddpe), and/or ground supply lines (e.g., vsse, vss).

As shown, at least one signal line 202 of the multiple signal lines is a wider signal line that is wider than one or more of the other signal lines 204A, 204B. The wider signal line 202 is coupled to the farthest local IO component (IO Bank 01) in reference to input pins and output pins 210 such that the wider signal line 202 reduces resistance. In some cases, the wider signal line 202 may be embodied as a wider metal signal line.

The one or more of the other signal lines 204A, 204B may include one or more narrower signal lines that are narrower than the wider signal line 202. In some cases, the one or more narrower signal lines 204A (used signal line) may be coupled to the nearest local IO component (IO Bank 23) in reference to input pins and output pins 210. Further, the one or more narrower signal lines 204A, 204B may be embodied as one or more narrower metal signal lines.

The narrower signal line 204A (white) may represent an active signal line, and the other narrower signal line 204B (cross-hatched) may represent an inactive signal line. Therefore, in this instance, the multiple signal lines 202, 204A, 204B may include active signal lines 202, 204A (i.e., used signal lines) and inactive signal lines 204B (i.e., unused signal lines), and the inactive signal lines 204B may be chopped by creating (or providing) an open or break 212. In some cases, the inactive signal lines 204B may be coupled to one or more of the active signal lines 202 in parallel to reduce resistance. This concept is shown and described in reference to FIG. 3.

As shown in FIG. 2, the routing circuitry 200 may refer to a 4 Bank multiplexer circuit (M4 FB4) having a bank multiplexer 220 (Bank MUX) that receives the signal lines 202, 204A and provides a Q output signal to the IO pin 210 based on at least one selection signal (Bank_Q_sel). In some cases, as shown, the bank multiplexer 220 may be coupled to the multiple banks (Bank 0-3) with one or more of the multiple signal lines 202, 204A, 204B. However, as described herein, various implementations of routing structures may incorporate various different types of structures, wherein the bank multiplexer may be embodied as a four (4) input multiplexer (e.g., Bank MUX 220 of FIG. 2), an eight (8) input multiplexer, or a sixteen (16) input multiplexer.

In reference to FIG. 2, the routing structure 200 provides routing for low power and improved performance in M4 FB4: M4 (Mux 4) with FB4 (Flexible Banking 4) memory macro. The routing structure 200 shows memory architecture (e.g., SRAM), wherein one of the outputs is routed from a farthest column in a wide metal track, and the metal track for a nearest column is in narrow metal, and part of the metal line after the nearest bank is cut and used for global supply routing. In some cases, wider metal reduces resistance (R) and improves performance, by chopping off of the metal above the nearest local bank so as to reduce unnecessary dynamic power consumption.

Figure 3:
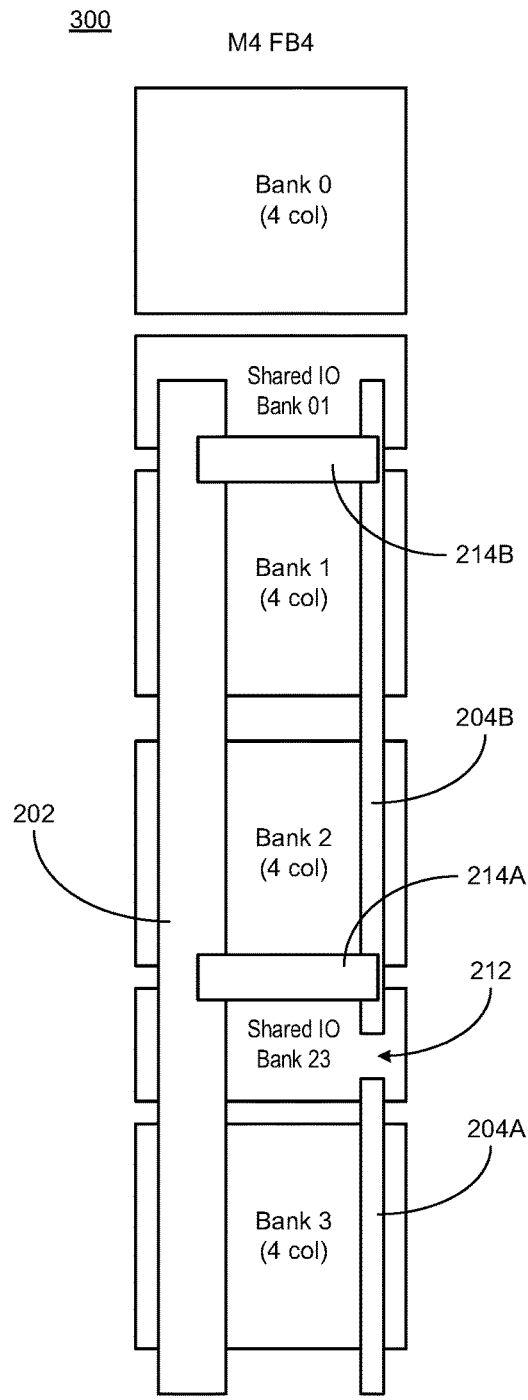

FIG. 3 illustrates a diagram of a routing structure 300 for memory applications in accordance with various implementations described herein. The routing structure 300 in FIG. 3 has similar elements of the routing structure 200 in FIG. 2.

As shown in FIG. 3, the routing structure 300 is similar to the routing structure 200 of FIG. 2, such as, e.g., a 4 Bank multiplexer circuit (M4 FB4), except that coupling lines 214A, 214B are used to couple the narrower inactive signal line 204B to the wider active signal line 202. Hence, as shown, the inactive signal lines 204B (i.e., unused signal lines) may be coupled to at least one of the active signal lines 202 (i.e., used signal lines) in parallel to reduce resistance.

In reference to FIG. 3, the routing structure 300 provides routing for low power and improved performance in M4 FB4: M4 (Mux 4) with FB4 (Flexible Banking 4) memory macro. Instead of coupling chopped metal to global routing, routing structure 300 provides a parallel path and has reduced R for output from the farthest bank. Use of this memory architecture in FIG. 3 for the wide flexible banking 8 instance may result in large savings in access time.

Figure 4:
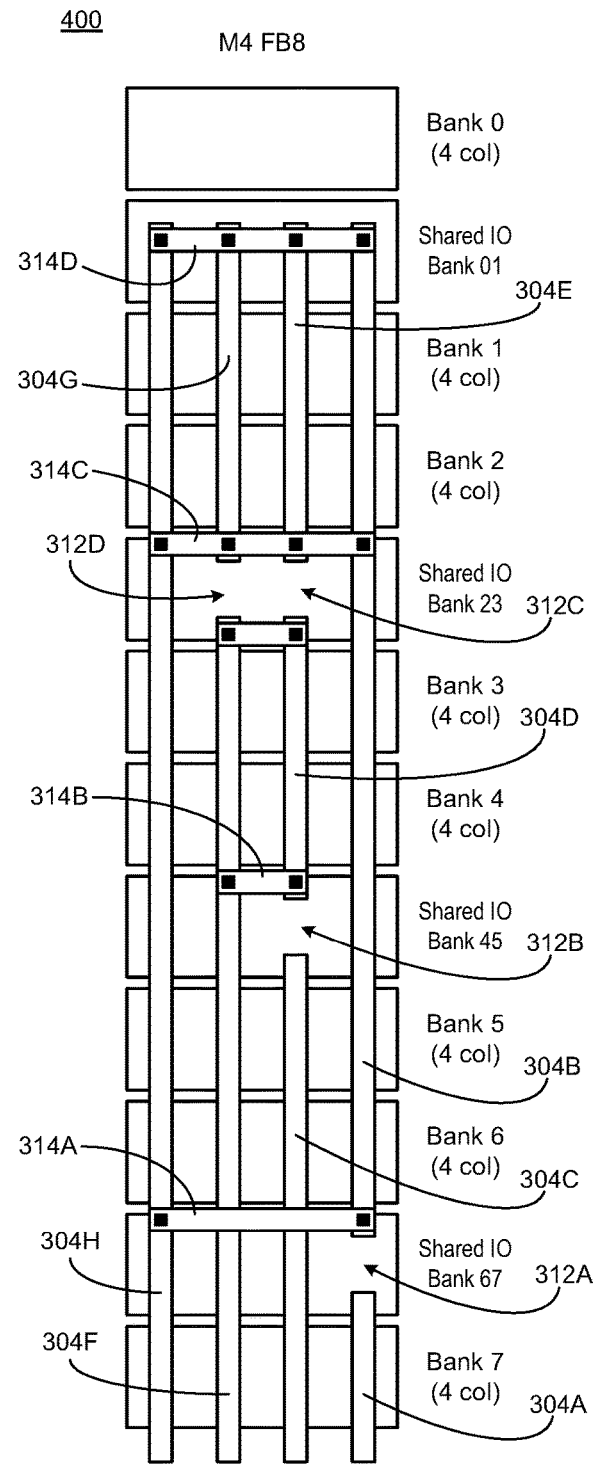

FIG. 4 illustrates a diagram of a routing structure 400 for memory applications in accordance with various implementations described herein. The routing structure 400 in FIG. 4 has similar elements of the routing structures 200, 300 in FIGS. 2-3.

In reference to FIG. 4, the routing structure 400 provides routing for low power and improved performance in M4 FB8: M4 (Mux 4) with FB8 (Flexible Banking 8) memory macro. As shown, the routing structure 400 may include multiple banks of memory cells (e.g., M4 FB8: Bank 0, Bank 1, Bank, 2, Bank 3, Bank 4, Bank 5, Bank 6, Bank 7). In some instances, the multiple banks of memory cells (Bank 0-7) may include multiple banks of bitcells, such as, e.g., HC, HD, or UHD bitcells. The pitch of the bitcells may vary depending on the memory application. For instance, each bank of memory cells may have a four (4), an eight (8), or a sixteen (16) bitcell pitch.

The routing structure 400 may include local IO components (IO Bank 01, IO bank 23, IO Bank 45, IO Bank 67) for each bank of the multiple banks (Bank 0-7). The IO components (IO Bank 01, IO bank 23, IO Bank 45, IO Bank 67) may be shared between multiple banks of memory cells. For instance, the IO Bank 01 may be shared by Bank 0 and Bank 1, the IO Bank 23 may be shared by Bank 2 and Bank 3, the IO Bank 45 may be shared by Bank 4 and Bank 5, and the IO Bank 67 may be shared by Bank 6 and Bank 7. In this instance, the IO Bank 01 may be referred to as a shared IO Bank 01, the IO Bank 23 may be referred to as a shared IO Bank 23, the IO Bank 45 may be referred to as a shared IO Bank 45, and the IO Bank 67 may be referred to as a shared IO Bank 67.

The routing structure 400 may include multiple signal lines 304A, 304B, 304C, 304D, 304E, 304F, 304G, 304H coupled to the multiple banks (Bank 0-7) with the local IO components (IO Bank 01, IO bank 23, IO Bank 45, IO Bank 67). The multiple signal lines 304A-304H may be embodied as data signal lines (e.g., d), output signal lines (e.g., Q0, Q1), enable signal lines (e.g., wen), voltage supply lines (e.g., vddce, vddpe), and/or ground supply lines (e.g., vsse, vss).

The multiple signal lines 304A-304H may include active signal lines and inactive signal lines. In this instance, the inactive signal lines 304B, 304D, 304E, 304G have been chopped by providing opens or breaks 312A, 312B, 312C, 312D and coupled to the active signal lines 304A, 304C, 304F, 304H in parallel to reduce resistance. Therefore, as shown in FIG. 4, coupling lines 314A, 314B, 314C, 314D are used to couple the inactive signal lines 304B, 304D, 304E, 304G to the active signal lines 304A, 304C, 304F, 304H with multiple vias (solid black rectangles). Hence, as shown, the inactive signal lines 304B, 304D, 304E, 304G may be coupled to one or more of the active signal lines 304A, 304C, 304F, 304H in parallel to assist with reducing resistance.

Figure 5:
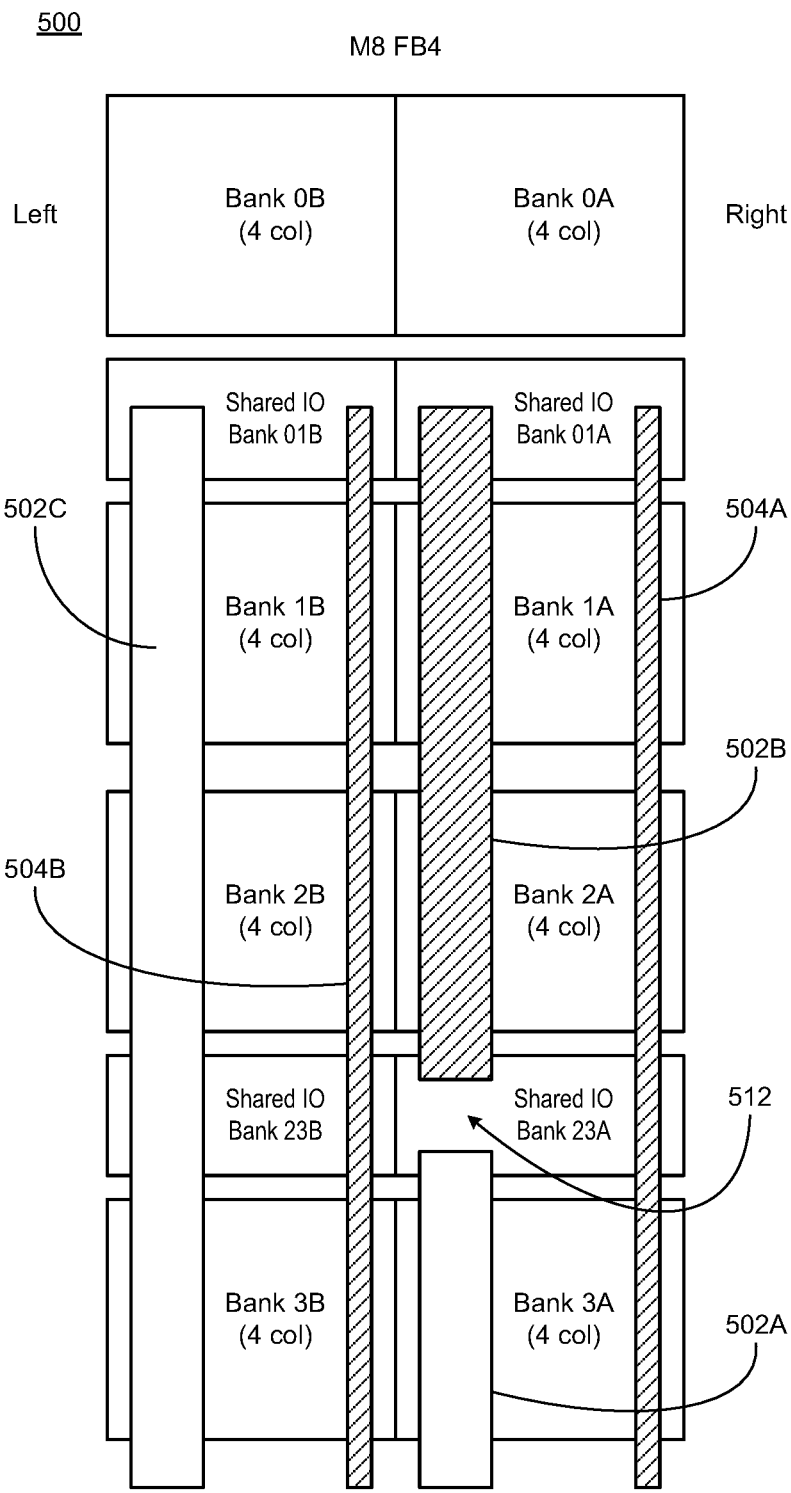

FIG. 5 illustrates a diagram of a routing structure 500 for memory applications in accordance with various implementations described herein. The routing structure 500 in FIG. 5 has similar elements of the routing structures 200-400 in FIGS. 2-4.

In reference to FIG. 5, the routing structure 500 provides routing for low power and improved performance in M8 FB4: M8 (Mux 8) with FB4 (Flexible Banking 4) memory macro. As shown, the routing structure 500 may include multiple banks of memory cells (e.g., M8 FB4: Right Bank 0A-3A and Left Bank 0B-3B). In some instances, the multiple banks of memory cells (Right Bank 0A-3A and Left Bank 0B-3B) may include multiple banks of bitcells, such as, e.g., HC, HD, or UHD bitcells. The pitch of the bitcells may vary depending on the memory application. For instance, each bank of memory cells may have a four (4), an eight (8), or a sixteen (16) bitcell pitch.

The routing structure 500 may include local input/output (IO) components (IO Bank 01A, IO bank 23A, IO Bank 01B, IO Bank 23B) for each bank of the multiple banks (Right Bank 0A-3A and Left Bank 0B-3B). The IO components (IO Bank 01, IO Bank 23, IO Bank 01B, IO Bank 23B) may be shared between multiple banks of memory cells. For instance, the IO Bank 01A may be shared by Bank 0A and Bank 1A, and the IO Bank 23A may be shared by Bank 2A and Bank 3A, and as such, the IO Bank 01A may be referred to as a shared IO Bank 01A, and the IO Bank 23A may be referred to as a shared IO Bank 23A. Further, the IO Bank 01B may be shared by Bank 0B and Bank 1B, and the IO Bank 23B may be shared by Bank 2B and Bank 3B, and as such, the IO Bank 01B may be referred to as a shared IO Bank 01B, and the IO Bank 23B may be referred to as a shared IO Bank 23B.

The routing structure 500 may include multiple signal lines 502A, 502B, 502C, 504A, 504B coupled to the multiple banks (Right Bank 0A-3A and Left Bank 0B-3B) with the local IO components (IO Bank 01A, IO bank 23A, IO Bank 01B, IO Bank 23B). The multiple signal lines 502A, 502B, 502C, 504A, 504B may be embodied as data signal lines (e.g., d), output signal lines (e.g., Q0, Q1), enable signal lines (e.g., wen), voltage supply lines (e.g., vddce, vddpe), and/or ground supply lines (e.g., vsse, vss).

As shown, some signal lines 502A, 502B, 502C of the multiple signal lines are wider signal lines that are wider than some other signal lines 504A, 504B. The wider signal lines 502A, 502B, 502C are coupled to the farthest local IO components (IO Bank 01A and IO Bank 01B) in reference to input pins and output pins such that the wider signal lines 502A, 502B, 502C reduce resistance. In some cases, the wider signal lines 502A, 502B, 502C may be embodied as wider metal signal lines.

The other signal lines 504A, 504B may include narrower signal lines that are narrower than the wider signal lines 502A, 502B, 502C. In some cases, the narrower signal lines 504A, 504B may be embodied as narrower metal signal lines.

The signal lines 502A, 502C (white) may represent active signal lines, and the other signal lines 502B, 504A, 504B (cross-hatched) may represent inactive signal lines. Therefore, in this instance, the multiple signal lines 502A, 502B, 502C, 504A, 504B may include active signal lines 502A, 502C (i.e., used signal lines) and inactive signal lines 502B, 504A, 504B (i.e., unused signal lines), and the inactive signal line 502B may be chopped from the active signal line 502A by creating (or providing) an open or break 512. In some cases, the inactive signal lines 502B, 504A, 504B may be coupled to the active signal lines 502A, 502C in parallel to reduce resistance. This feature is shown and described in reference to FIG. 6.

Figure 6:
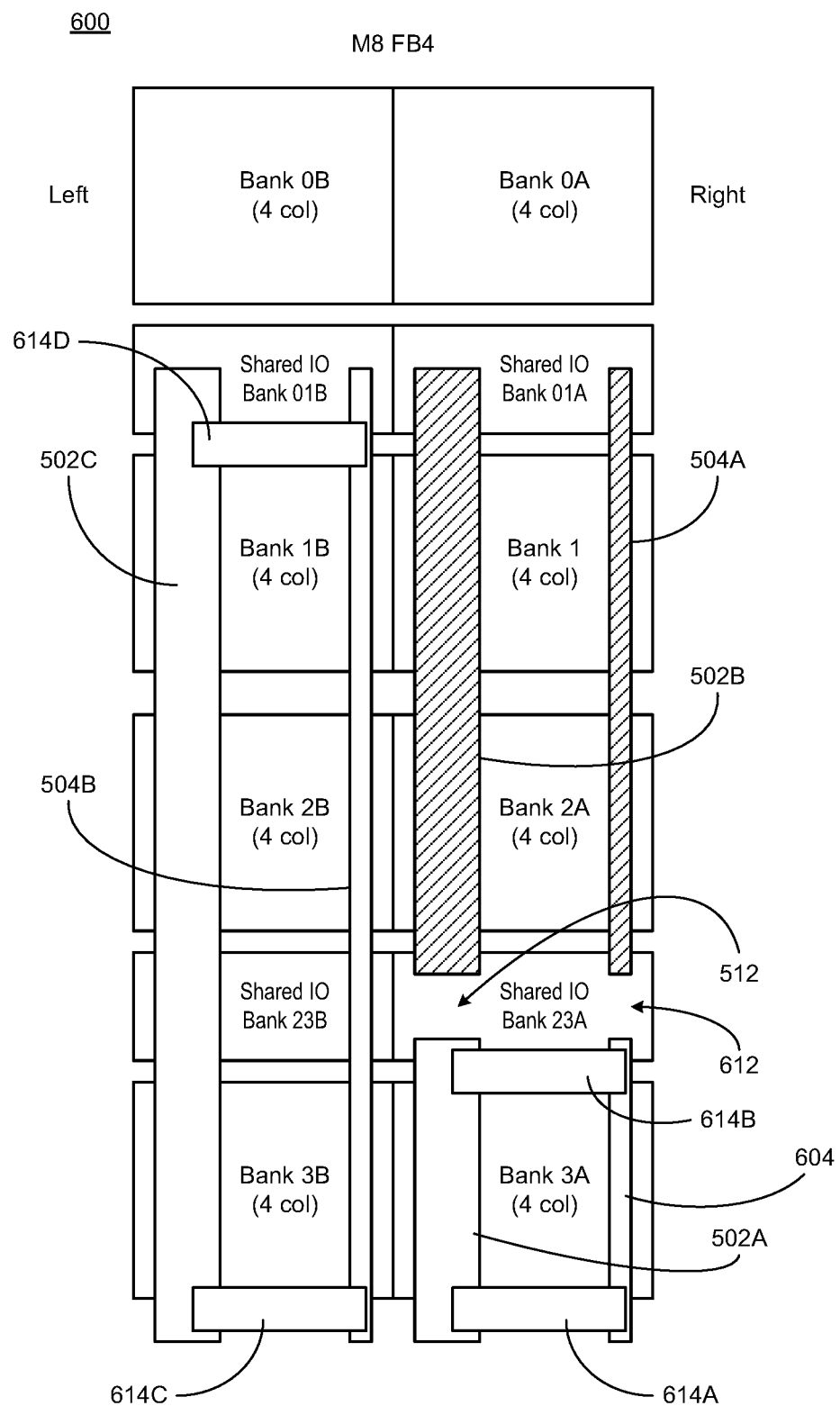

FIG. 6 illustrates a diagram of a routing structure 600 for memory applications in accordance with various implementations described herein. The routing structure 600 in FIG. 6 has similar elements of the routing structure 500 in FIG. 5.

In reference to FIG. 6, the routing structure 600 provides routing for low power and improved performance in M8 FB4: M8 (Mux 8) with FB4 (Flexible Banking 4) memory macro. As shown, the routing structure 600 is similar to the routing structure 500 of FIG. 5, such as, e.g., an 8 Bank multiplexer circuit (M8 FB4), except that coupling lines 514A, 514B, 514C, 514D are used to couple inactive signal lines 604, 504B to the wider active signal lines 502A, 502C. Thus, as shown, the inactive signal lines 604, 504B (i.e., unused signal lines) may be coupled to the active signal lines 502A, 502C (i.e., used signal lines) in parallel to reduce resistance. In some cases, the narrower signal line 504A is cut or split to form an open or break 612, and the inactive portion 604 of the signal line 504A is coupled to the active signal line 502A with coupling lines 614A, 614B. Further, the inactive signal line 504B is coupled to the active signal line 502C with coupling lines 614C, 614D. This parallel coupling assists with reducing resistance.

Figure 7:
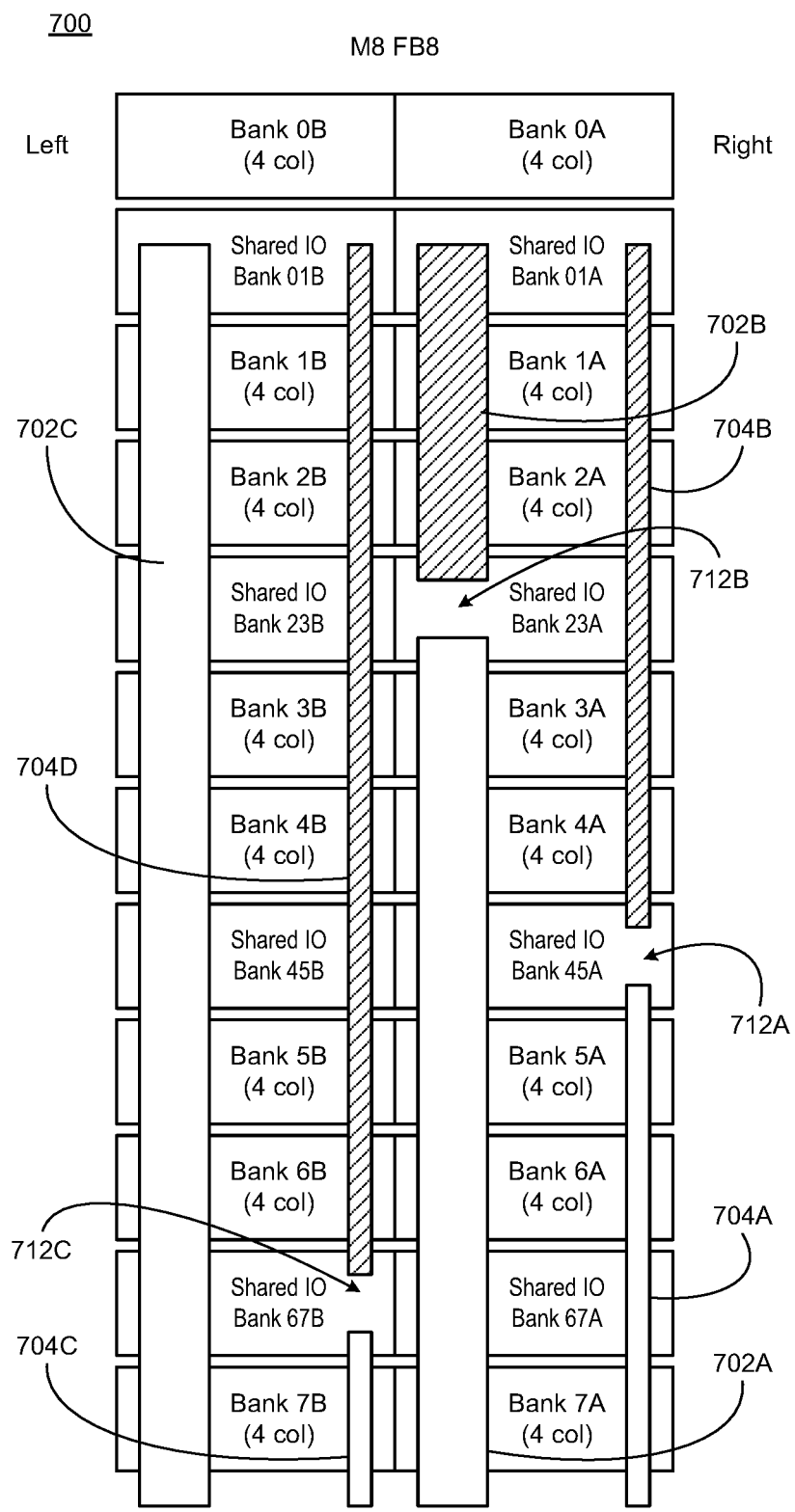

FIG. 7 illustrates a diagram of a routing structure 700 for memory applications in accordance with various implementations described herein. The routing structure 700 in FIG. 7 has similar elements of the routing structures 200-600 in FIGS. 2-6.

In reference to FIG. 7, the routing structure 700 provides routing for low power and improved performance in M8 FB8: M8 (Mux 8) with FB8 (Flexible Banking 8) memory macro. As shown, the routing structure 700 may include multiple banks of memory cells (e.g., M8 FB8: Right Bank 0A-7A and Left Bank 0B-7B). In some instances, the multiple banks of memory cells (Right Bank 0A-7A and Left Bank 0B-7B) may include multiple banks of bitcells, such as, e.g., HC, HD, or UHD bitcells. The pitch of the bitcells may vary depending on the memory application. For instance, each bank of memory cells may have a four (4), an eight (8), or a sixteen (16) bitcell pitch.

The routing structure 700 may include local input/output (IO) components (IO Bank 01A, IO Bank 23A, IO Bank 45A, IO Bank 67A, IO Bank 01B, IO Bank 23B, IO Bank 45B, IO Bank 67B) for each bank of the multiple banks (Right Bank 0A-7A and Left Bank 0B-7B). The IO components (IO Bank 01A, IO Bank 23A, IO Bank 45A, IO Bank 67A, IO Bank 01B, IO Bank 23B, IO Bank 45B, IO Bank 67B) may be shared between multiple banks of memory cells. For instance, the IO Bank 01A may be shared by Bank 0A and Bank 1A, the IO Bank 23A may be shared by Bank 2A and Bank 3A, the IO Bank 45A may be shared by Bank 4A and Bank 5A, and the IO Bank 67A may be shared by Bank 6A and Bank 7A. As such, the IO Bank 01A may be referred to as a shared IO Bank 01A, and the IO Bank 23A may be referred to as a shared IO Bank 23A, the IO Bank 45A may be referred to as a shared IO Bank 45A, and the IO Bank 67A may be referred to as a shared IO Bank 67A. Further, the IO Bank 01B may be shared by Bank 0B and Bank 1B, the IO Bank 23B may be shared by Bank 2B and Bank 3B, the IO Bank 45B may be shared by Bank 4B and Bank 5B, and the IO Bank 67B may be shared by Bank 6B and Bank 7B. As such, the IO Bank 01B may be referred to as a shared IO Bank 01B, and the IO Bank 23B may be referred to as a shared IO Bank 23B, the IO Bank 45B may be referred to as a shared IO Bank 45B, and the IO Bank 67B may be referred to as a shared IO Bank 67B.

The routing structure 700 may include multiple signal lines 702A, 702B, 702C, 704A, 704B, 704C, 704D coupled to the multiple banks (Right Bank 0A-7A and Left Bank 0B-7B) with the local IO components (IO Bank 01A, IO Bank 23A, IO Bank 45A, IO Bank 67A, IO Bank 01B, IO Bank 23B, IO Bank 45B, IO Bank 67B). The multiple signal lines 702A, 702B, 702C, 704A, 704B, 704C, 704D may be embodied as data signal lines (e.g., d), output signal lines (e.g., Q0, Q1), enable signal lines (e.g., wen), voltage supply lines (e.g., vddce, vddpe), and/or ground supply lines (e.g., vsse, vss).

As shown, some signal lines 702A, 702B, 702C of the multiple signal lines are wider signal lines that are wider than some other signal lines 704A, 704B, 704C, 704D. The wider signal lines 702A, 702B, 702C are coupled to the farthest local IO components (IO Bank 01A and IO Bank 01B) in reference to input pins and output pins such that the wider signal lines 702A, 702B, 702C reduce resistance. In some cases, the wider signal lines may be embodied as wider metal signal lines.

In some instances, the other signal lines 704A, 704B, 704C, 704D may include narrower signal lines that are narrower than the wider signal lines 702A, 702B, 702C. In some cases, the narrower signal lines 704A, 704B, 704C, 704D may be embodied as narrower metal signal lines.

The signal lines 702A, 702C, 704A, 704C (white) may represent active signal lines, and the other signal lines 702B, 704B, 704D (cross-hatched) may represent inactive signal lines. Therefore, in this instance, the multiple signal lines 702A, 702B, 702C, 704A, 704B, 704C, 704D may include active signal lines 702A, 702C, 704A, 704C (i.e., used signal lines) and inactive signal lines 702B, 704B, 704D (i.e., unused signal lines), and the inactive signal lines 704B, 704D may be chopped from the active signal lines 704A, 704C by creating (or providing) opens or breaks 712A, 712B, 712C. In some cases, the inactive signal lines 702B, 704B, 704D may be coupled to the active signal lines 702A, 702C, 704A, 704C in parallel to reduce resistance. This feature is shown and described in reference to FIG. 8.

Figure 8:
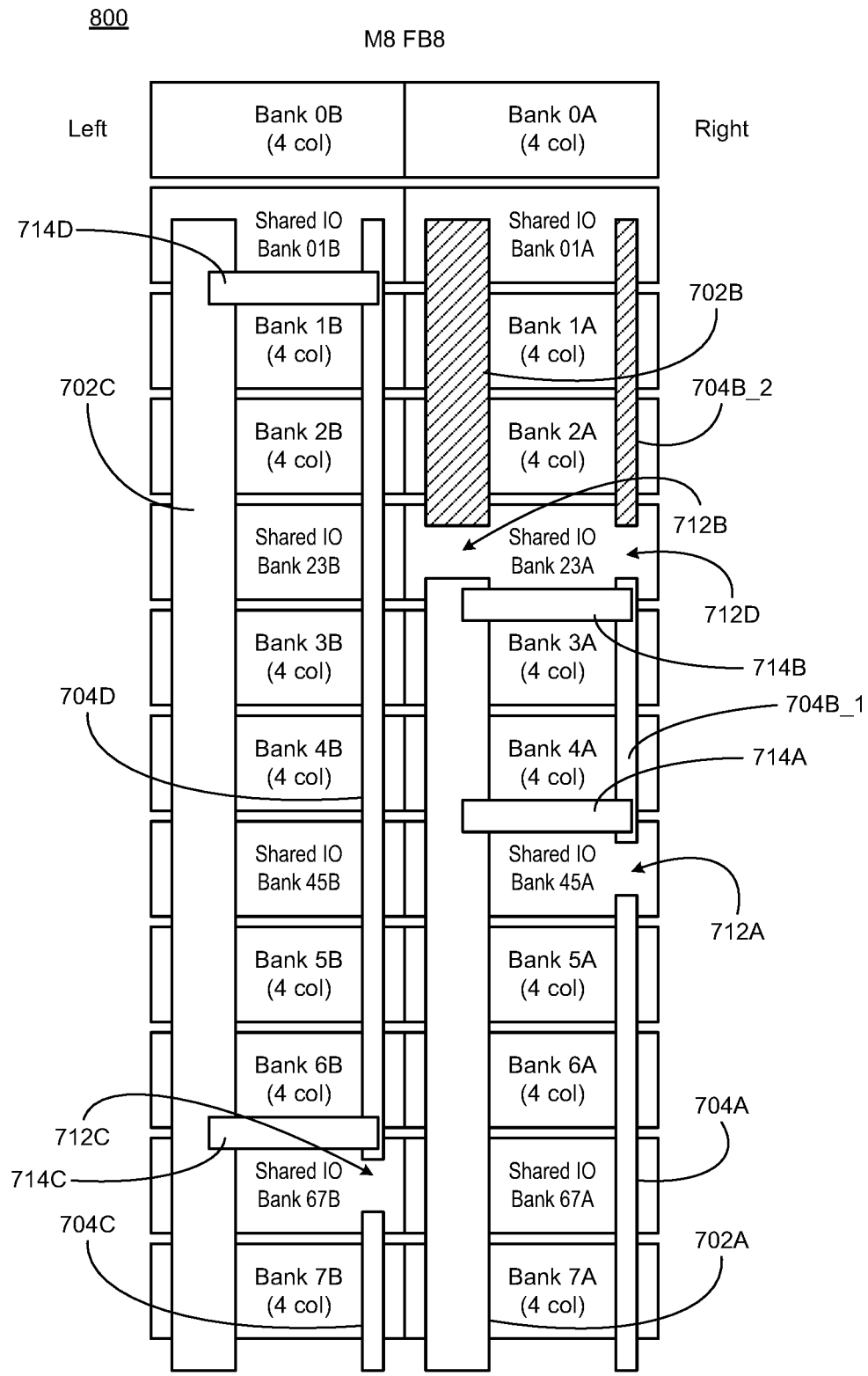

FIG. 8 illustrates a diagram of a routing structure 800 for memory applications in accordance with various implementations described herein. The routing structure 800 in FIG. 8 has similar elements of the routing structure 700 in FIG. 7.

In reference to FIG. 8, the routing structure 800 provides routing for low power and improved performance in M8 FB8: M8 (Mux 8) with FB8 (Flexible Banking 8) memory macro. As shown, the routing structure 800 is similar to the routing structure 700 of FIG. 7, such as, e.g., an 8 Bank multiplexer circuit (M8 FB8), except that coupling lines 714A, 714B, 714C, 714D are used to couple inactive signal lines 704B_1, 704D to the wider active signal lines 702A, 702C. Therefore, as shown, the inactive signal lines 704B_1, 704D (i.e., unused signal lines) may be coupled to the active signal lines 702A, 702C (i.e., used signal lines) in parallel to reduce resistance. In some cases, the narrower signal line 704B is cut or split to form an open or break 712D, and the inactive portion 704B_1 of the signal line 704B is coupled to the active signal line 702A with coupling lines 714A, 714B. The inactive signal line 704D is coupled to the active signal line 702C with coupling lines 714C, 714D. This parallel coupling assists with reducing resistance.

Figure 9:
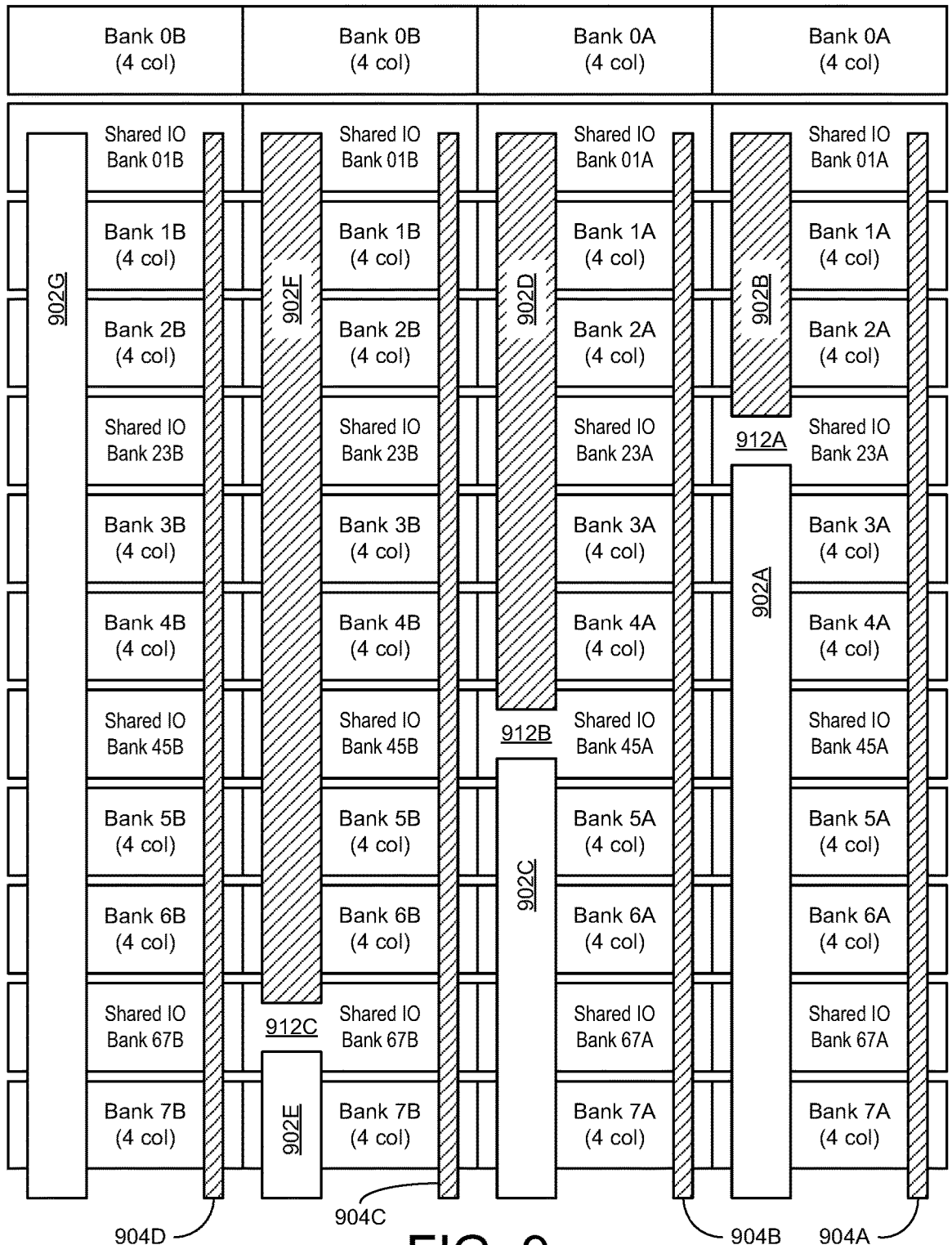

FIG. 9 illustrates a diagram of a routing structure 900 for memory applications in accordance with various implementations described herein. The routing structure 900 in FIG. 9 has similar elements of the routing structures 200-800 in FIGS. 2-8.

In reference to FIG. 9, the routing structure 900 provides routing for low power and improved performance in M16 FB8: M16 (Mux 16) with FB8 (Flexible Banking 8) memory macro. As shown, the routing structure 900 may include multiple banks of memory cells (e.g., M16 FB8: 2 Right Banks: R1 0A-7A, R2 0A-7A and 2 Left Banks: L1 0B-7B, L2 0B-7B). In some instances, the multiple banks of memory cells (R1 0A-7A, R2 0A-7A, L1 0B-7B, L2 0B-7B) may include multiple banks of bitcells, such as, e.g., HC, HD, or UHD bitcells. The pitch of the bitcells may vary depending on the memory application. For instance, each bank of memory cells may have a four (4), an eight (8), or a sixteen (16) bitcell pitch.

The routing structure 900 may include local input/output (IO) components (IO Bank 01A, IO Bank 23A, IO Bank 45A, IO Bank 67A, IO Bank 01B, IO Bank 23B, IO Bank 45B, IO Bank 67B) for each bank of the multiple banks (R1 0A-7A, R2 0A-7A, L1 0B-7B, L2 0B-7B). The IO components (IO Bank 01A, IO Bank 23A, IO Bank 45A, IO Bank 67A, IO Bank 01B, IO Bank 23B, IO Bank 45B, IO Bank 67B) may be shared between multiple banks of memory cells. For instance, for R1 0A-7A and R2 0A-7A, the IO Bank 01A may be shared by Bank 0A and Bank 1A, the IO Bank 23A may be shared by Bank 2A and Bank 3A, the IO Bank 45A may be shared by Bank 4A and Bank 5A, and the IO Bank 67A may be shared by Bank 6A and Bank 7A. As such, for R1 0A-7A and R2 0A-7A, the IO Bank 01A may be referred to as a shared IO Bank 01A, and the IO Bank 23A may be referred to as a shared IO Bank 23A, the IO Bank 45A may be referred to as a shared IO Bank 45A, and the IO Bank 67A may be referred to as a shared IO Bank 67A. Further, for L1 0B-7B and L2 0B-7B, the IO Bank 01B may be shared by Bank 0B and Bank 1B, the IO Bank 23B may be shared by Bank 2B and Bank 3B, the IO Bank 45B may be shared by Bank 4B and Bank 5B, and the IO Bank 67B may be shared by Bank 6B and Bank 7B. As such, for L1 0B-7B and L2 0B-7B, the IO Bank 01B may be referred to as a shared IO Bank 01B, and the IO Bank 23B may be referred to as a shared IO Bank 23B, the IO Bank 45B may be referred to as a shared IO Bank 45B, and the IO Bank 67B may be referred to as a shared IO Bank 67B.

The routing structure 900 may include multiple signal lines 902A, 902B, 902C, 902D, 902E, 902F, 902G, 904A, 904B, 904C, 904D coupled to the multiple banks (R1 0A-7A, R2 0A-7A, L1 0B-7B, L2 0B-7B) with the local IO components (for R1 0A-7A, R2 0A-7A, L1 0B-7B, L2 0B-7B, IO Bank 01A, IO Bank 23A, IO Bank 45A, IO Bank 67A, IO Bank 01B, IO Bank 23B, IO Bank 45B, IO Bank 67B). The multiple signal lines 902A, 902B, 902C, 902D, 902E, 902F, 902G, 904A, 904B, 904C, 904D may be embodied as data signal lines (e.g., d), output signal lines (e.g., Q0, Q1), enable signal lines (e.g., wen), voltage supply lines (e.g., vddce, vddpe), and/or ground supply lines (e.g., vsse, vss).

As shown, some signal lines 902A, 902B, 902C, 902D, 902E, 902F, 902G of the multiple signal lines are wider signal lines that are wider than some other signal lines 904A, 904B, 904C, 904D. The wider signal lines 902A, 902B, 902C, 902D, 902E, 902F, 902G are coupled to the farthest local IO components (for R1 0A-7A, R2 0A-7A, L1 0B-7B, L2 0B-7B, IO Bank 01A and IO Bank 01B) in reference to input pins and output pins such that one or more of the wider signal lines 902A, 902B, 902C, 902D, 902E, 902F, 902G reduce resistance. In some cases, the wider signal lines may be embodied as wider metal signal lines.

In some instances, the other signal lines 904A, 904B, 904C, 904D may include narrower signal lines that are narrower than the wider signal lines 902A, 902B, 902C, 902D, 902E, 902F, 902G. In some cases, the narrower signal lines 904A, 904B, 904C, 904D may be embodied as narrower metal signal lines.

The signal lines 902A, 902C, 902E, 902G (white) may represent active signal lines, and the other signal lines 902B, 902D, 902F, 904A, 904B, 904C, 904D (cross-hatched) may represent inactive signal lines. As such, in this instance, the multiple signal lines 902A, 902B, 902C, 902D, 902E, 902F, 902G, 904A, 904B, 904C, 904D may include active signal lines 902A, 902C, 902E, 902G (i.e., used signal lines) and inactive signal lines 902B, 902D, 902F, 904A, 904B, 904C, 904D (i.e., unused signal lines), and some of the inactive signal lines 902B, 902D, 902F may be chopped from the active signal lines 902A, 902C, 902E by creating (or providing) opens or breaks 912A, 912B, 912C. In some cases, one or more of the inactive signal lines 902B, 902D, 902F, 904A, 904B, 904C, 904D may be coupled to one or more of the active signal lines 902A, 902C, 902E, 902G in parallel to reduce resistance. This feature is shown and described in reference to FIG. 10.

Figure 10:
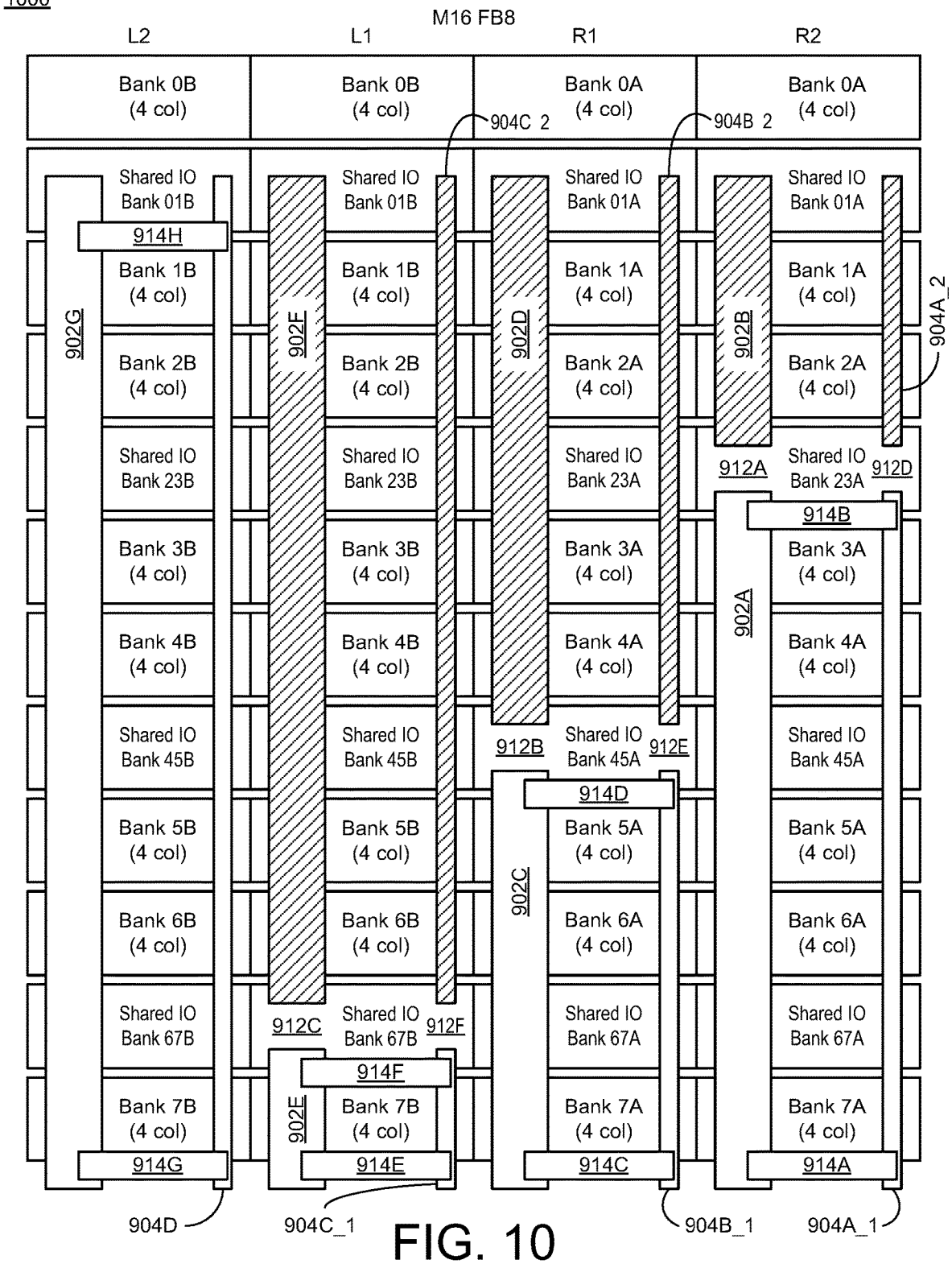

FIG. 10 illustrates another routing structure 1000 for memory applications in accordance with various implementations described herein. The routing structure 1000 in FIG. 10 has similar elements of the routing structure 900 in FIG. 9.

In reference to FIG. 10, the routing structure 1000 provides routing for low power and improved performance in M16 FB8: M16 (Mux 16) with FB8 (Flexible Banking 8) memory macro. As shown, the routing structure 1000 is similar to the routing structure 900 of FIG. 9, such as, e.g., a 16 Bank multiplexer circuit (M16 FB8), except that coupling lines 914A, 914B, 914C, 914D, 914E, 914F, 914G, 914H are used to couple inactive signal lines 904A_1, 904B_1, 904C_1, 904D to the wider active signal lines 902A, 902C, 902E, 902G. Thus, as shown, the inactive signal lines 904A_1, 904B_1, 904C_1, 904D (i.e., unused signal lines) may be coupled to the active signal lines 902A, 902C, 902E, 902G (i.e., used signal lines) in parallel to reduce resistance. In some cases, the narrower signal line 904A is cut or split to form an open or break 912D, and the inactive portion 904A_1 of the signal line 904A is coupled to the active signal line 902A with coupling lines 914A, 914B. The narrower signal line 904B is cut or split to form an open or break 912E, and the inactive portion 904B_1 of the signal line 904B is coupled to the active signal line 902C with coupling lines 914C, 914D. The narrower signal line 904C is cut or split to form an open or break 912F, and the inactive portion 904C_1 of the signal line 904C is coupled to the active signal line 902E with coupling lines 914E, 914F. The narrower inactive signal line 904D is coupled to the active signal line 902G with coupling lines 914G, 914H. This parallel coupling assists with reducing resistance.

Figure 11:
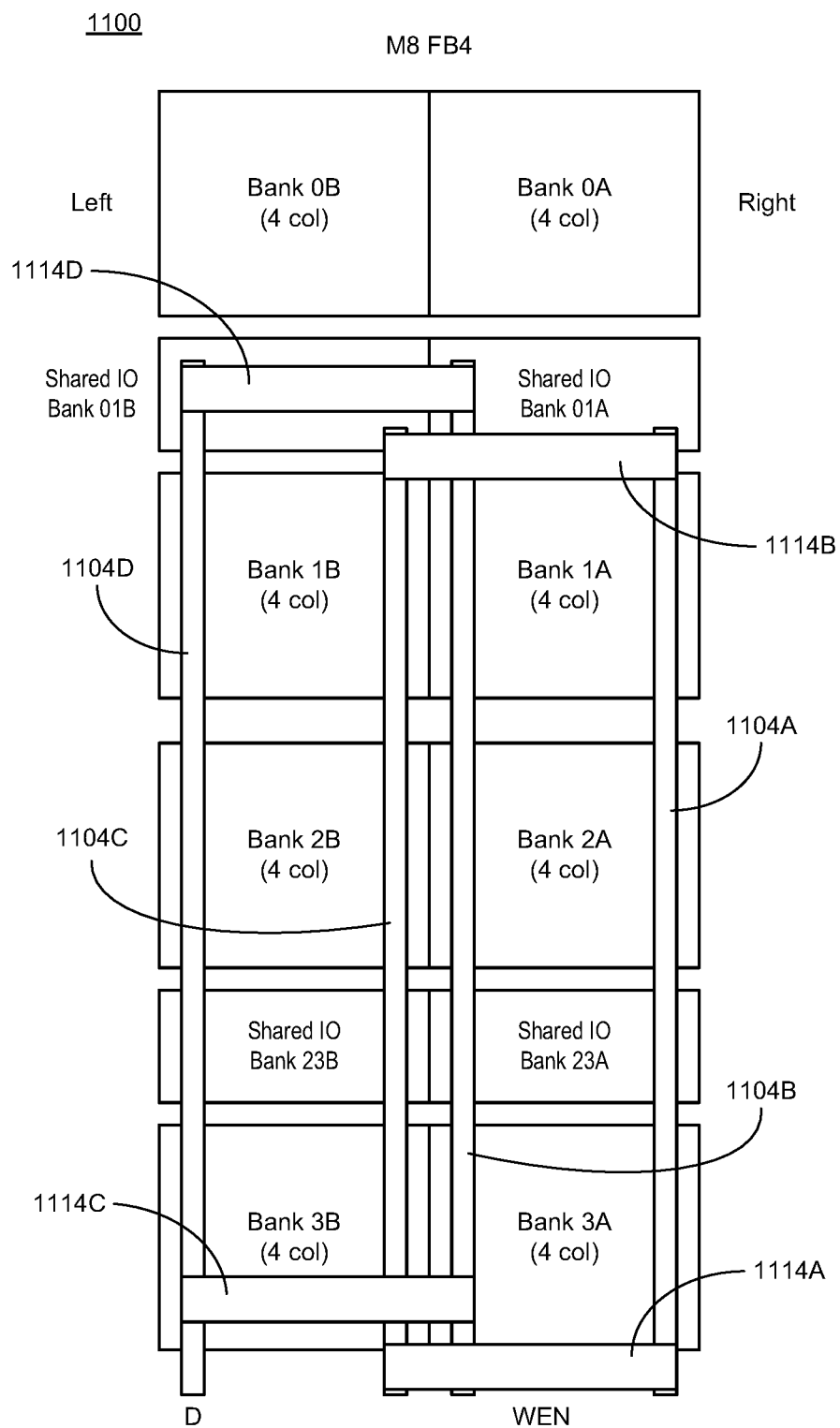

FIG. 11 illustrates another routing structure 1100 for memory applications in accordance with various implementations described herein. The routing structure 1100 in FIG. 11 has similar elements of the routing structures 500-600 in FIGS. 5-6.

As shown in FIG. 11, routing structure 1100 is similar to the routing structure 600 of FIG. 6, such as, e.g., an 8 Bank multiplexer circuit (M8 FB4), except that coupling lines 1114A, 1114B, 1114C, 1114D are used to couple inactive signal lines 1104A, 1104C to active signal lines 1104B, 1104D. Thus, as shown, the inactive signal lines 1104A, 1104C (i.e., unused signal lines) may be coupled to the active signal lines 1104B, 1104D (i.e., used signal lines) in parallel to reduce resistance. This parallel coupling assists with reducing resistance. Prior to coupling, the inactive signal lines 1104A, 1104C are inactive, and once coupled, the inactive signal lines 1104A, 1104C are no longer inactive.

In reference to FIG. 11, shorting unused lines (or inactive lines) may improve setup time of inputs data/write enable. For instance, the routing structure 1100 provides routing for improving performance of the input Data (D) pin and the write enable (WEN) pin. In M4 (Mux 4), some routing structures may be limited by the number of data lines (D) and the number of wen lines (WEN). However, in some cases, as shown in FIG. 11, for M8 (Mux 8), since only one input data (D) and only one write enable (WEN) is provided to a multiplexer (MUX), any extra unused data and wen lines may be shorted to have reduced resistance for input signals.

Figure 12:
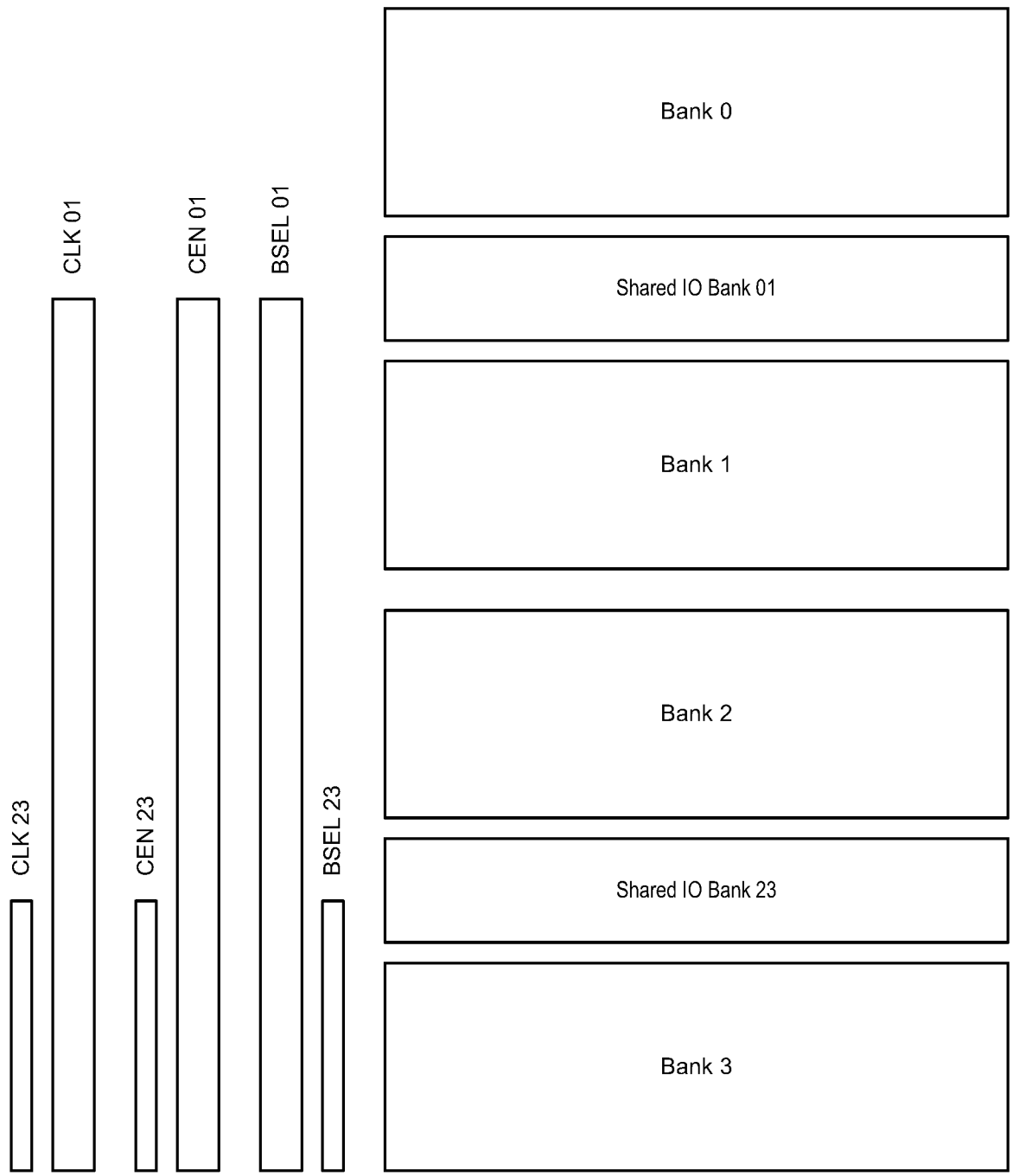

FIG. 12 illustrates another routing structure 1200 for memory applications in accordance with various implementations described herein.

In reference to FIG. 12, timing improvement may be achieved for clock (CLK), address, and various other control signals by utilizing wider metal for a farthest bank. In some instances, the term "address" may refer to an input address, such as, e.g., an address for bank selection, as described herein with BSEL01 and BSEL23, which refer to bank address. For instance, the routing structure 1200 provides routing for improving performance of one or more signals, such as, e.g., CLK 01, CEN 01, BSEL 01, with wider metal lines to a farthest bank 01 than other narrower metal lines, such as, e.g., CLK 23, CEN 23, BSEL 23 to a nearer bank 23. As with a data path over a bitcell array, control circuitry in memory may be crowded and is resource constrained for metal routing. Thus, various implementations provided herein provide optimized routing by routing signals for a farthest distance in wider metal and ones with a nearer distance in narrower metal. For instance, in FIG. 12, clock for farthest bank (CLK01), chip enable for farthest bank (CEN 01), and bank select for farthest bank (BSEL 01) is routed in wider metal and/or spacing, while other similar signals (CLK 23, CEN 23, BSEL 23) for a nearer bank are routed in narrower width and/or spacing. Similar to the data paths for address signals and/or control signals in memory compiler, performance may be improved by using wider metal for signals to top/upper or farthest banks. Compilers may be designed for a maximum number of rows per bitline, different available options, and a maximum number of banks. As the number of banks, rows, or other compiler option is reduced, unused tracks may be programmed for coupling in parallel with critical nets so that effective resistance may be reduced.

Figure 13:
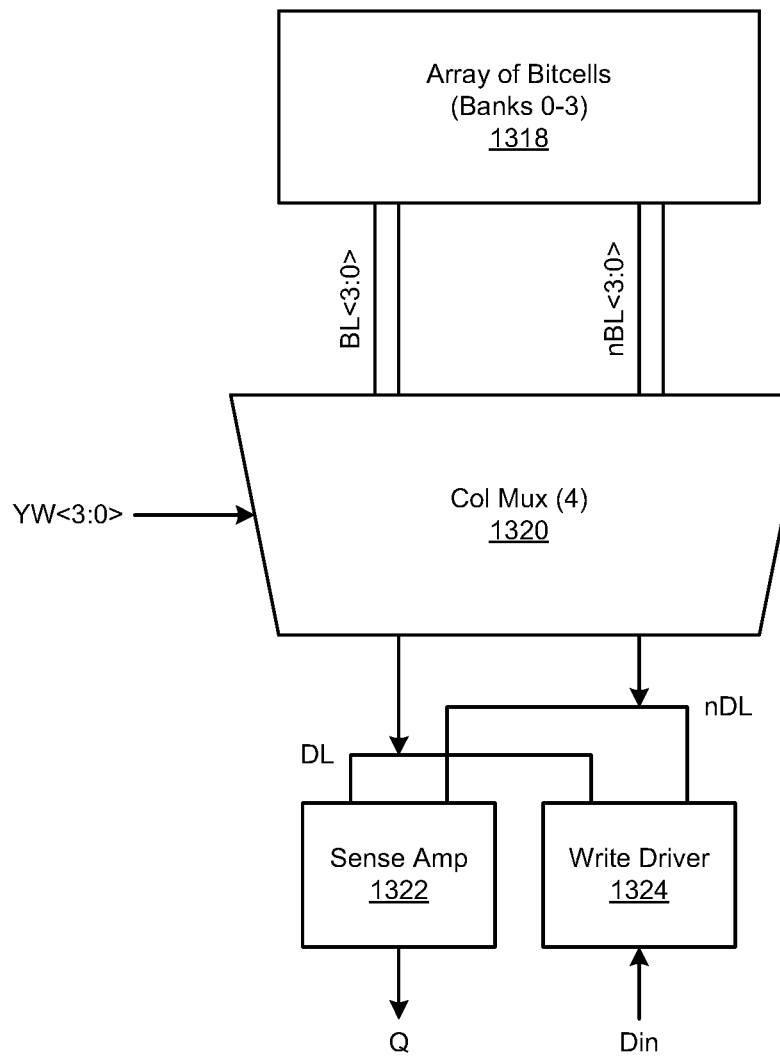

FIG. 13 illustrates another routing structure 1300 for memory applications in accordance with various implementations described herein.

As shown in FIG. 13, the routing structure 1300 may include an array of memory cells 1318 (e.g., Banks 0-3). The routing structure 1300 may include a column multiplexer driver 1320 that couples multiple bitlines (BL<3:0>, nBL<3:0>) to the memory cells in the array of memory cells 1318. The routing structure 1300 may include multiple sets of signal lines (DL, nDL) that couple the multiple bitlines (BL<3:0>, nBL<3:0>) to a sense amplifier 1322 or a write driver 1324. The sets of signal lines (DL, nDL) may include an active set of signal lines and an inactive set of signal lines. The corresponding pairs of the active set of signal lines and the inactive set of signal lines are coupled in parallel to reduce resistance.

In some implementations, the multiple bitlines (BL<3:0>, nBL<3:0>) may include 4 bitline pairs. In some cases, a column select signal (YW<3:0>) may be used to select at least one of the bitline pairs. The sets of signal lines (DL, nDL) may include a data line (DL) and a complementary n data line (nDL), which may be outputs of the column multiplexer driver 1320 (Col Mux (4)). The sense amplifier 1322 may provide an output signal (Q), and the write driver 1324 may receive an input signal (Din). The write driver 1324 may receive the data input signal Din and provide the data signal (DL) and a complementary data signal (nDL). The sense amplifier may receive the data signal (DL) and the complementary data signal (nDL) and provide the output signal (Q).

In reference to FIG. 13, routing structure 1300 provides routing for low power and improved performance in M16 (Mux 16) for M4 (Mux 4), wherein timing improvement may be achieved for a write driver YW signal for M4 (Mux 4) by using unused YW signal of M16 (Mux 16). In this instance, timing improvement may be achieved by reusing mux input and select for FB8 in FB4 for parallel driving of the Q output.

Figure 14:
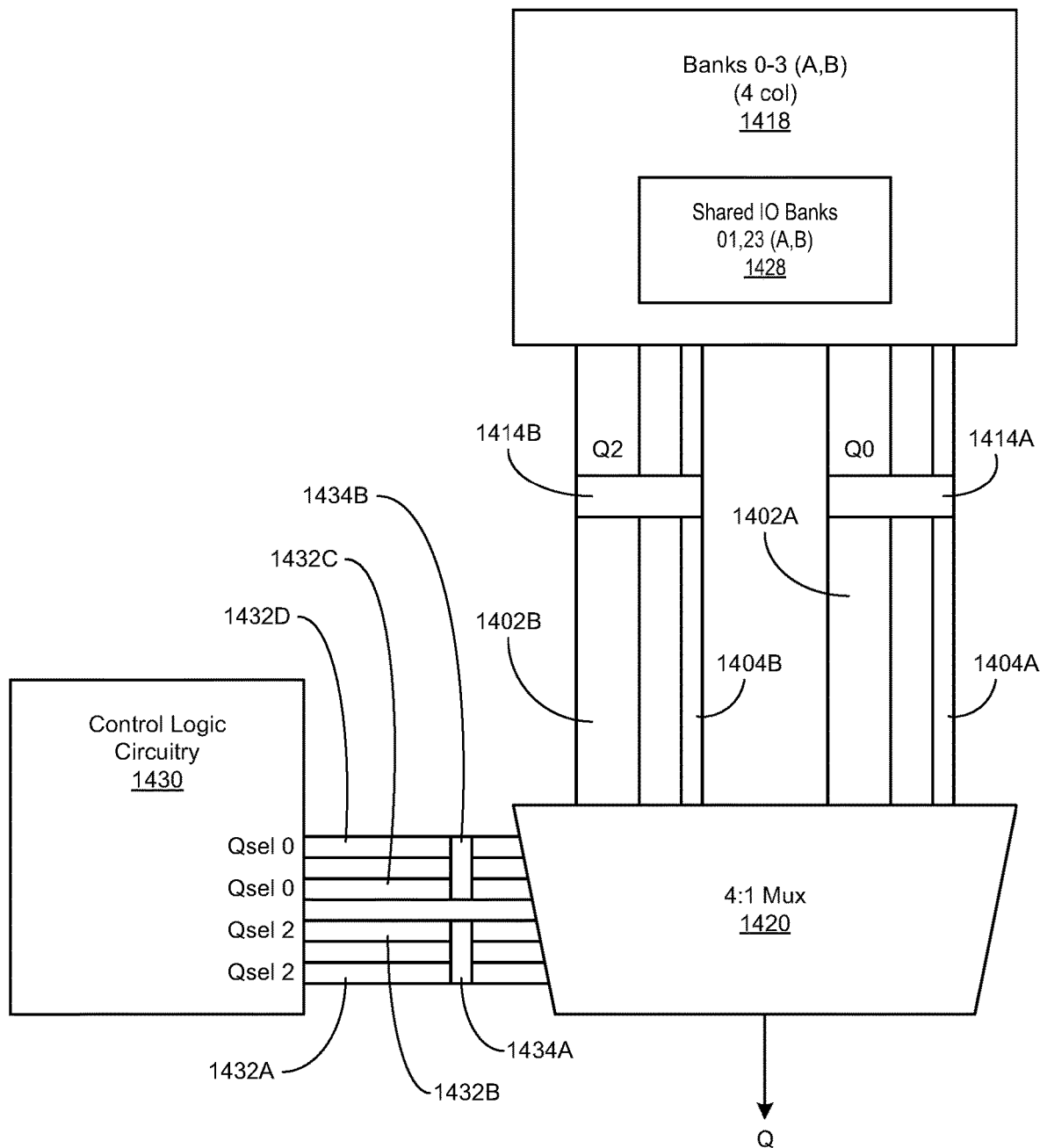

FIG. 14 illustrates another routing structure 1400 for memory applications in accordance with various implementations described herein.

As shown in FIG. 14, the routing structure 1400 may include multiple banks of memory cells 1418 (e.g., Banks 0-3) along with local input/output (IO) components 1428 (e.g., Shared IO Banks 01, 23 (A, B)) for each bank of the multiple banks 1418 (e.g., Banks 0-3). The routing structure 1400 may be referred to as a reused bank select multiplexer (Mux) from FB8 to FB4. The routing structure 1400 provides a reused flexible bank mux from FB8 to FB4 along with reused select signals and inputs. Further, the routing structure 1400 may include multiple signal lines 1402A (Q0), 1402B (Q2), 1404A, 1404B that are coupled to the multiple banks 1418 (e.g., Banks 0-3) with the local IO components 1428 (e.g., Shared IO Banks 01, 23 (A, B)). The routing structure 1400 may include control logic circuitry 1430 that provides multiple selection signals via multiple selection signal lines 1432 (Qsel 0, Qsel 2).

The routing structure 1400 may include multiplexer circuitry 1420 (4:1 Mux) that receives the multiple signal lines 1402A, 1402B, 1404A, 1404B and the multiple selection signals (Qsel 0, Qsel 2) and provides an output signal (Q) based on the multiple selection signals (Qsel 0, Qsel 2). The Bank Sel Mux 1420 may be used for selecting one output out of 2 for FB4 with the select signals and the input shorted at the Mux level. Further, the multiple selection signal lines 1432 (Qsel 0, Qsel 2) may include active selection signal lines 1432A, 1432C and inactive selection signal lines 1432B, 1432D, and corresponding pairs of the active selection signal lines 1432A, 1432C and the inactive selection signal lines 1432B, 1432D may be coupled in parallel with coupling lines 1434A, 1434B to reduce resistance. Further, in some cases, corresponding pairs of the multiple signal lines 1402A, 1402B, 1404A, 1404B may be coupled in parallel with coupling lines 1414A, 1414B to reduce resistance.

Described herein are various implementations of an integrated circuit. The integrated circuit may include multiple banks of memory cells. The integrated circuit may include a local input/output (IO) component for each bank of the multiple banks. The integrated circuit may include multiple signal lines coupled to the multiple banks with the local IO components. Further, at least one signal line of the multiple signal lines is wider than one or more of the other signal lines.

Described herein are various implementations of an integrated circuit. The integrated circuit may include multiple banks of memory cells. The integrated circuit may include a local input/output (IO) components for each bank of the multiple banks. The integrated circuit may include multiple signal lines coupled to the multiple banks with the local IO components. The multiple signal lines may include active signal lines and inactive signal lines. The inactive signal lines may be chopped to provide an open or break and are coupled to the active signal lines in parallel to reduce resistance.

Described herein are various implementations of an integrated circuit. The integrated circuit may include an array of memory cells. The integrated circuit may include a column multiplexer driver that couples multiple bitlines to the memory cells in the array of memory cells. The integrated circuit may include multiple sets of signal lines that couple the multiple bitlines to a sense amplifier or a write driver. The multiple sets of signal lines may include an active set of signal lines and an inactive set of signal lines, and corresponding pairs of the active set of signal lines and the inactive set of signal lines are coupled in parallel to reduce resistance.

Described herein are various implementations of an integrated circuit. The integrated circuit may include multiple banks of memory cells. The integrated circuit may include a local input/output (IO) component for each bank of the multiple banks. The integrated circuit may include multiple signal lines coupled to the multiple banks with the local IO components. The integrated circuit may include control logic circuitry providing multiple selection signals via multiple selection signal lines. The integrated circuit may include multiplexer circuitry that receives the multiple signal lines and the multiple selection signals and provides an output signal based on the multiple selection signals. The multiple selection signal lines may include active selection signal lines and inactive selection signal lines, and corresponding pairs of the active selection signal lines and the inactive selection signal lines are coupled in parallel to reduce resistance.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   multiple banks of memory cells;
   a local input/output (IO) component for each bank of the multiple banks;
   multiple signal lines coupled to the multiple banks with the local IO components,
   wherein at least one signal line of the multiple signal lines is wider than one or more other signal lines of the multiple signal lines, and
   wherein the at least one signal line is coupled to the farthest local IO component and at least one of the one or more other signal lines is coupled to the nearest local IO component in reference to input pins and output pins.

2. The integrated circuit of claim 1, wherein the multiple banks of memory cells comprise multiple banks of ultra high density (UHD) bitcells.

3. The integrated circuit of claim 1, wherein each bank of memory cells of the multiple banks of memory cells comprises a four (4) bitcell pitch.

4. The integrated circuit of claim 1, wherein the multiple signal lines comprise one or more data signal lines, one or more data output signal lines, one or more enable signal lines, one or more voltage supply lines, and one or more ground supply lines.

5. The integrated circuit of claim 1, wherein the local IO components are shared between the multiple banks of memory cells.

6. The integrated circuit of claim 1, wherein the at least one signal line comprises a wider metal signal line.

7. The integrated circuit of claim 1, wherein the one or more of the other signal lines comprise one or more narrower signal lines that are narrower than the at least one signal line, and wherein the one or more narrower signal lines are coupled to the nearest local IO component in reference to input pins and output pins.

8. The integrated circuit of claim 7, wherein the one or more narrower signal lines comprise one or more narrower metal signal lines.

9. The integrated circuit of claim 1, wherein the multiple signal lines comprise active signal lines and inactive signal lines, and wherein the inactive signal lines are chopped to create an open or break.

10. The integrated circuit of claim 9, wherein the inactive signal lines are coupled to the active signal lines in parallel to reduce resistance.

11. The integrated circuit of claim 1, further comprising a bank multiplexer that is coupled to the multiple banks with the multiple signal lines, wherein the bank multiplexer comprises a four (4) input multiplexer, an eight (8) input multiplexer, or a sixteen (16) input multiplexer.

12. An integrated circuit, comprising:
multiple banks of memory cells;
local input/output (IO) components for each bank of the multiple banks; and
multiple signal lines coupled to the multiple banks with the local IO components,
wherein the multiple signal lines comprise active signal lines and inactive signal lines, and
wherein the inactive signal lines are chopped to provide an open or break and are coupled to the active signal lines in parallel to reduce resistance.

13. The integrated circuit of claim 12, wherein the multiple banks of memory cells comprise multiple banks of ultra high density (UHD) bitcells, and wherein each bank of memory cells of the multiple banks of memory cells comprises a four (4) bitcell pitch.

14. The integrated circuit of claim 12, wherein the multiple signal lines comprise one or more data signal lines, one or more data output signal lines, one or more enable signal lines, one or more voltage supply lines, and one or more ground supply lines.

15. The integrated circuit of claim 12, wherein the local IO components are shared between multiple banks of memory cells.

16. An integrated circuit, comprising:
an array of memory cells;
a column multiplexer driver that couples multiple bitlines to the memory cells in the array of memory cells; and
multiple sets of signal lines that couple the multiple bitlines to a sense amplifier or a write driver,
wherein the multiple sets of signal lines include an active set of signal lines and an inactive set of signal lines, and
wherein corresponding pairs of the active set of signal lines and the inactive set of signal lines are coupled in parallel to reduce resistance.

17. The integrated circuit of claim 16, wherein the write driver receives a data input signal and provides a data signal and a complementary data signal, and wherein the sense amplifier receives the data signal and the complementary data signal and provides an output signal.

18. An integrated circuit, comprising:
multiple banks of memory cells;
a local input/output (IO) component for each bank of the multiple banks;
multiple signal lines coupled to the multiple banks with the local IO components,
control logic circuitry providing multiple selection signals via multiple selection signal lines; and
multiplexer circuitry that receives the multiple signal lines and the multiple selection signals and provides an output signal based on the multiple selection signals,
wherein the multiple selection signal lines include active selection signal lines and inactive selection signal lines, and
wherein corresponding pairs of the active selection signal lines and the inactive selection signal lines are coupled in parallel to reduce resistance.

19. The integrated circuit of claim 18, wherein corresponding pairs of the multiple signal lines are coupled in parallel to reduce resistance.

* * * * *